(12) United States Patent
Periyannan et al.

(10) Patent No.: US 11,682,595 B2
(45) Date of Patent: Jun. 20, 2023

(54) SYSTEM AND METHOD FOR WARPAGE DETECTION IN A CMOS BONDED ARRAY

(71) Applicant: Western Digital Technologies, Inc., San Jose, CA (US)

(72) Inventors: Kirubakaran Periyannan, Santa Clara, CA (US); Daniel Linnen, Naperville, IL (US); Jayavel Pachamuthu, San Jose, CA (US)

(73) Assignee: Western Digital Technologies, Inc., San Jose, CA (US)

( * ) Notice: Subject to any disclaimer, the term of this patent is extended or adjusted under 35 U.S.C. 154(b) by 151 days.

(21) Appl. No.: 17/181,675

(22) Filed: Feb. 22, 2021

(65) Prior Publication Data
US 2022/0093476 A1 Mar. 24, 2022

Related U.S. Application Data

(60) Provisional application No. 63/082,051, filed on Sep. 23, 2020.

(51) Int. Cl.
*H01L 21/66* (2006.01)
*G01B 7/16* (2006.01)

(52) U.S. Cl.
CPC ............... *H01L 22/34* (2013.01); *G01B 7/16* (2013.01); *H01L 22/12* (2013.01); *H01L 22/14* (2013.01)

(58) Field of Classification Search
None
See application file for complete search history.

(56) References Cited

U.S. PATENT DOCUMENTS

| | | | |
|---|---|---|---|
| 6,362,634 B1 | 3/2002 | Jarvis et al. | |
| 7,250,311 B2 | 7/2007 | Aoki et al. | |
| 9,257,352 B2 | 2/2016 | Daubenspeck et al. | |
| 9,435,852 B1 | 9/2016 | Kim et al. | |
| 2019/0333829 A1 | 10/2019 | Chen et al. | |
| 2020/0006291 A1 | 1/2020 | Mohr et al. | |
| 2020/0105557 A1 | 4/2020 | Yeh et al. | |
| 2020/0381316 A1* | 12/2020 | Lee | H01L 22/32 |

FOREIGN PATENT DOCUMENTS

| | | |
|---|---|---|
| TW | M587361 U | 12/2019 |
| TW | I705481 B | 9/2020 |
| WO | 2019167294 A1 | 9/2019 |

* cited by examiner

*Primary Examiner* — Alexander G Ghyka
(74) *Attorney, Agent, or Firm* — Crowell & Moring LLP

(57) ABSTRACT

A system and method for warpage detection in a CMOS bonded array includes a conductor positioned between bonded contact pads of first and second wafers. The conductor is connected to a continuity check circuit. If the continuity check circuit detects an interruption in conductivity of the conductor, such interruption is indicative of warpage in the first and/or second wafers. In one implementation, the conductor is a serpentine-shaped structure.

20 Claims, 6 Drawing Sheets

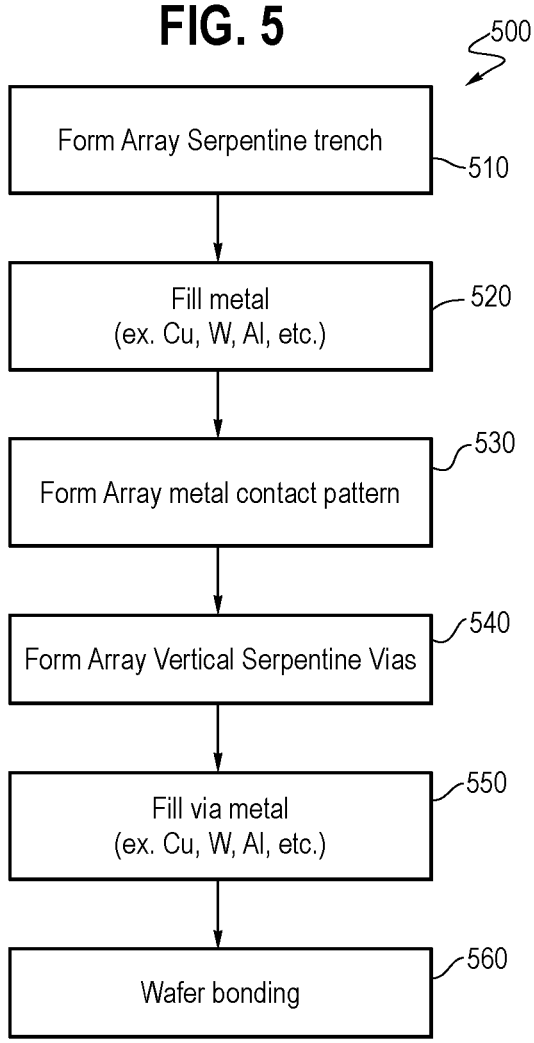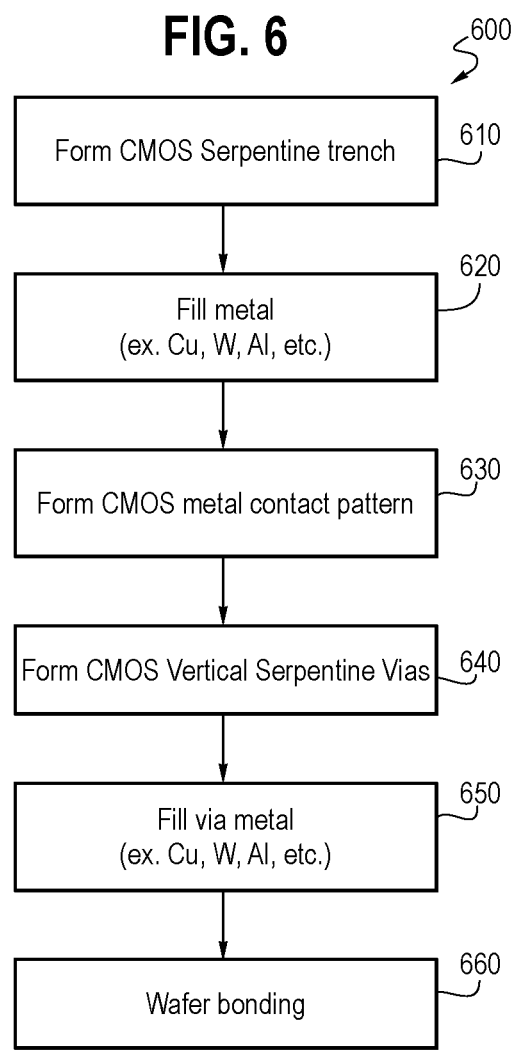

SYSTEM AND METHOD FOR WARPAGE DETECTION IN A CMOS BONDED ARRAY

CROSS-REFERENCE TO RELATED APPLICATION

This application claims the benefit of U.S. provisional patent application No. 63/082,051, filed Sep. 23, 2020, which is hereby incorporated by reference.

BACKGROUND

A memory wafer and a complementary metal-oxide-semiconductor (CMOS) wafer containing control circuitry for the memory can be fabricated separately and then bonded together. The resulting structure is referred to as a CMOS bonded array. Warpage in either or both of the wafers can cause a break in the bonding of opposing contact pads of the wafers, which can result in a die that is not functional.

BRIEF DESCRIPTION OF THE DRAWINGS

FIG. 5 is a flow chart of a method of an embodiment for manufacturing a first portion of a conductor in a first wafer.

FIG. 6 is a flow chart of a method of an embodiment for manufacturing a second portion of a conductor in a second wafer.

DETAILED DESCRIPTION

By way of introduction, the following embodiments provide a Design for Test (DFT) structure to detect die/wafer warpage in a complementary metal-oxide-semiconductor (CMOS) bonded array (CBA). In one example, the DFT structure is configured in the form of a serpentine-shaped structure that runs next to important signals or a group of important signals. The serpentine-shaped structure is connected to a continuity check circuit across a CMOS wafer and an array wafer. In case of warpage, one or more joints in the serpentine-shaped structure do not conduct, which assists in the detection of the die/wafer warpage. The serpentine-shaped structure may be embodied as either a single large conductor across the entire die/wafer or multiple, separate conductors across various zones of the die/wafer.

Figure 1:
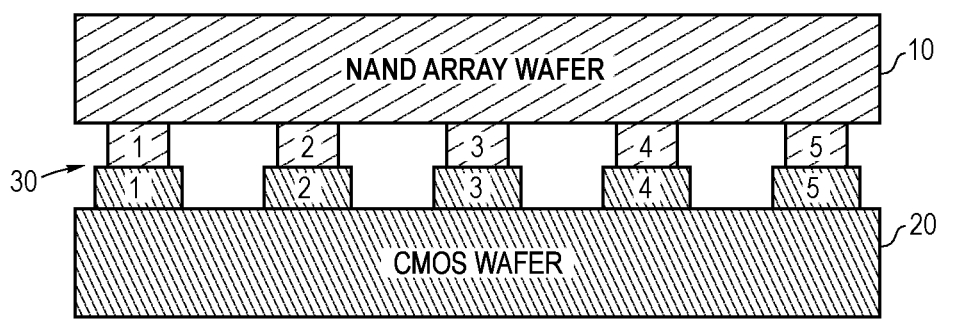
FIG. 1 is a diagram of an integrated circuit of an embodiment.

Turning now to the drawings, FIG. 1 is a diagram illustrating an integrated circuit 100 of an embodiment. As shown in FIG. 1, the integrated circuit 100 comprises a first wafer 10 and a second wafer 20, each with a respective plurality of contact pads 1, 2, 3, 4, 5. The first and second wafers 10, 20 can take any suitable form. For example, in this embodiment, the first wafer 10 comprises a memory array (here, a NAND memory array), and the second wafer comprises peripheral circuitry for the memory array (implemented here as a complementary metal-oxide-semiconductor (CMOS) wafer). The peripheral circuitry can contain, for example, transistors, logic signals, and circuitry for controlling and driving memory elements to accomplish functions such as programming and reading. It should be noted that these are merely examples, and other implementations can be used.

The first and second wafers 10, 20 can be manufactured separately and then bonded together by bonding the plurality of contact pads 1, 2, 3, 4, 5 of each of the wafers 10, 20 together. When the corresponding plurality of contact pads 1, 2, 3, 4, 5 are bonded together, they form a plurality of pillars 30. The resulting integrated circuit can yield one memory die or a plurality of memory dies, which can be diced to create individual memory dies. As a wafer can contain one or more than one die, the term "wafer," as used herein, is intended to broadly refer to an individual memory die or to a plurality of memory dies.

Figure 2A:
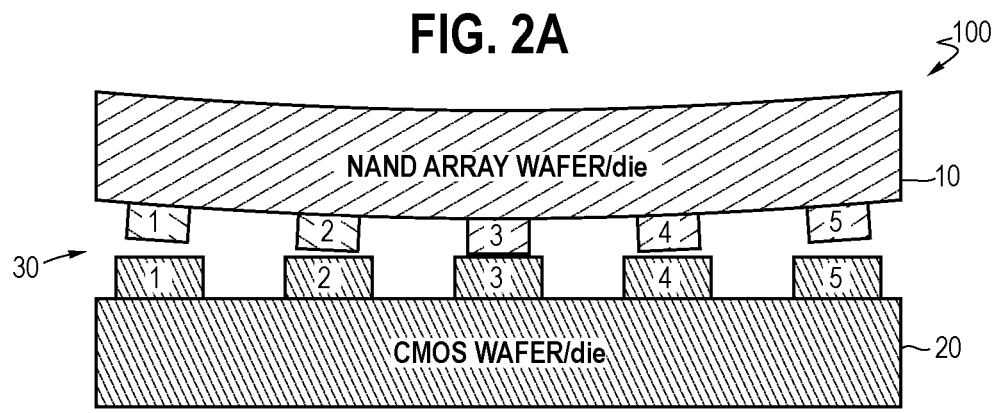
FIG. 2A is a diagram of an integrated circuit of an embodiment illustrating concave warpage in a wafer.
Figure 2B:
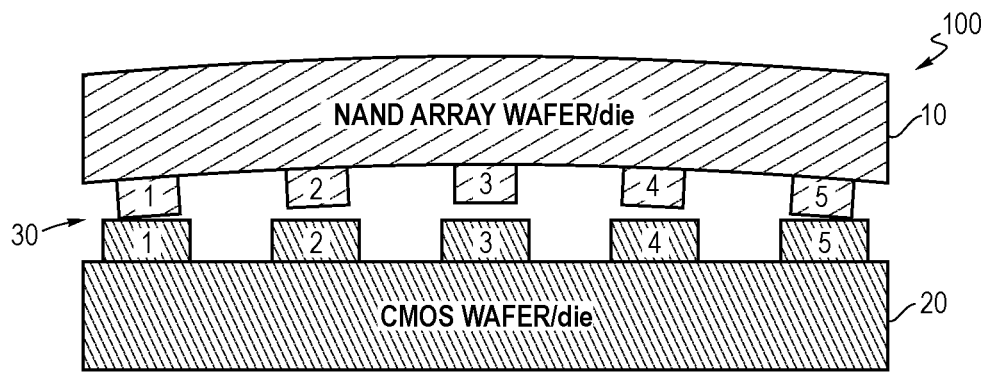
FIG. 2B is a diagram of an integrated circuit of an embodiment illustrating convex warpage in a wafer.

Warpage in one or both of the wafers 10, 20 can result in a dead or not-fully-functional memory die. For example, FIG. 2A shows concave warpage in the first wafer 10 which results in a break in continuity of the outermost contact pads, and FIG. 2B shows convex warpage in the first wafer 10 which results in a break in continuity of the innermost contact pads. While not shown, in addition to or instead of the first wafer 10, the second wafer 20 can have warpage. Unfortunately, it can be difficult or impossible to detect warpage in one or both of the wafers 10, 20.

Figure 3:
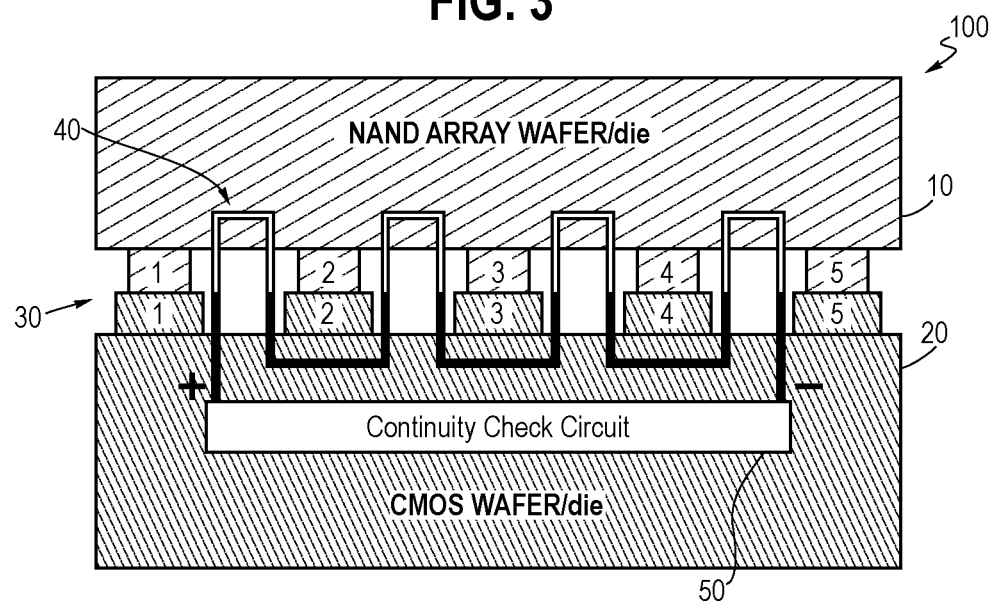
FIG. 3 is a diagram of an integrated circuit of an embodiment comprising a continuity check circuit and a serpentine-shaped conductor.

The following embodiments can be used to address this issue. As shown in FIG. 3, in one embodiment, the integrated circuit 100 comprises a conductor 40 that is positioned in the first and second wafers 10, 20 and in between at least some of the plurality of pillars 30. In this example, the conductor 40 runs through the first and second wafers 10, 20 and between the plurality of pillars 30 (e.g., next to important signals or groups of important signals) in a serpentine shape. In other examples, the conductor 40 has a different shape.

Figure 4:
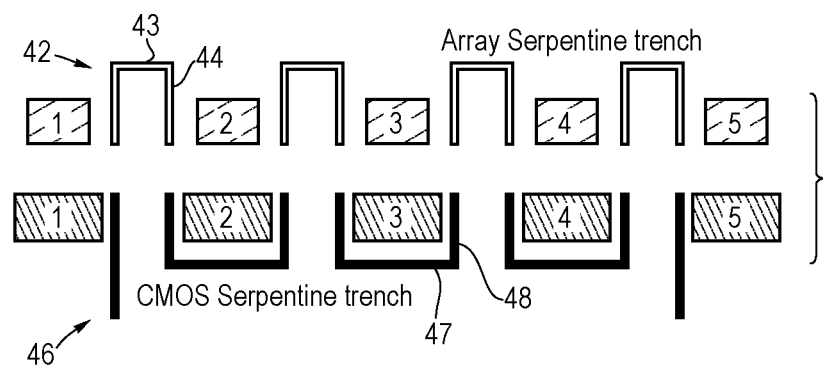
FIG. 4 is a diagram illustrating first and second portions of a serpentine-shaped conductor of an embodiment.

As shown in FIG. 4, in this embodiment, the conductor 40 comprises a first portion 42 formed in the first wafer 10 and a second portion 46 formed in the second wafer 20. Here, the first and second portions 42, 46 comprise respective horizontal components 43, 47 and vertical components 44, 48. In this embodiment, the ends of the vertical components 44, 48 are the same height as the contact pads 1, 2, 3, 4, 5. So, the ends of the vertical components 44, 48 are bonded together at the same time the contact pads 1, 2, 3, 4, 5 are bonded together.

In this embodiment, the horizontal components 43, 47 are metal-filled trenches, and the vertical components 44, 48 are metal-filled vertical interconnect access structures (vias). FIG. 5 is a flow chart 500 of a method of an embodiment for fabricating the horizontal and vertical components 43, 44 in the first portion 42 of the conductor 40 in the first wafer 10.

As shown in FIG. 5, first, an array serpentine trench is formed (act 510). Then, the trench is filled with metal, such as copper (Cu), tungsten (W), or aluminum (Al) (act 520). Next, the array metal contact pattern is formed (act 530). This is followed by the formation of the array vertical serpentine vias (act 540), which are filled with metal (act 550). The first wafer 10 is then ready for bonding with the second wafer 20 (act 560).

FIG. 6 is a flow chart 600 of a method of an embodiment for fabricating the horizontal and vertical components 47, 48 in the second portion 46 of the conductor 40 in the second wafer 20. As shown in FIG. 6, first, the CMOS serpentine trench is formed (act 610). Then, the trench is filled with metal (act 620). Next, the CMOS metal contact pattern is formed (act 630). This is followed by the formation of the CMOS vertical serpentine vias (act 640), which are filled with metal (act 650). The second wafer 20 is then ready for bonding with the first wafer 10 (act 660).

Returning to FIG. 3, in this embodiment, the integrated circuit 100 also comprises a continuity check circuit 50 that is electrically coupled with the conductor 40 and configured to detect warpage in the first and/or second wafers 10, 20 by detecting an interruption in conductivity of the conductor 40. In this embodiment, the continuity check circuit 50 is in the second wafer 20; however, the continuity check circuit 50 can be located elsewhere in other embodiments.

Figure 7:
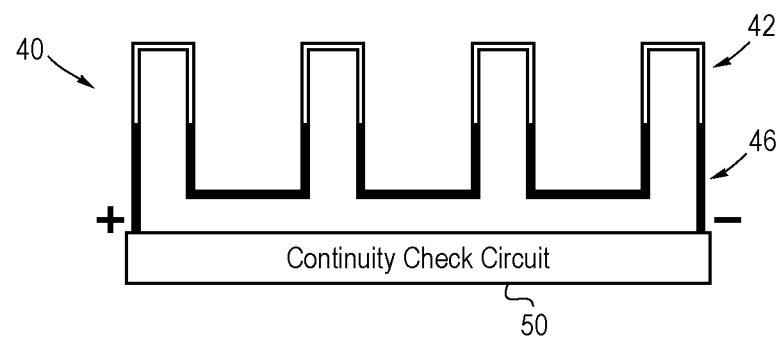
FIG. 7 is a diagram illustrating an unbroken conductor of an embodiment, which indicates no warpage.
Figure 8:
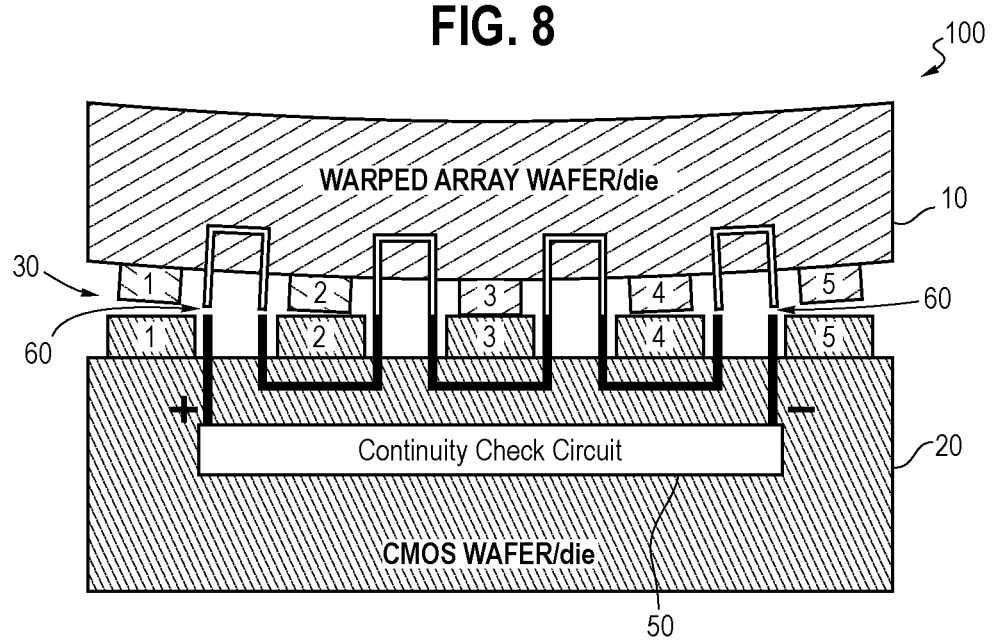
FIG. 8 is a diagram illustrating a broken conductor of an embodiment, which indicates warpage.

As shown in FIG. 7, when the ends of all the vertical components of the first and second portions 42, 46 of the conductor 40 are bonded together, a complete circuit is formed with the continuity check circuit 50. That is, a lack of interruption in the conductor 40 allows current to flow between the positive and negative contacts of the continuity check circuit 50. However, as shown in FIG. 8, when warpage occurs in one of the wafers (here, the first wafer 10, but warpage can occur in the second wafer 20 instead of or in addition to the first wafer 10), the bond between at least one of the contacts 1, 2, 3, 4, 5 and the vertical portions of the conductor 40 near those contacts is broken, meaning at least one of the joints of the conductor 40 will not conduct electricity. This results in one or more areas of discontinuity 60 in the conductor 40, which prevents current from flowing between the positive and negative contacts of the continuity check circuit 50 because of the break in electrical conductivity of the conductor 40. That is, the broken joints will become more resistive (or open) if there is any damage to the bond pads or the wire traces, which would be likely in the case of wafer warpage. So, this interruption in current, as detected by the continuity check circuit 50, can be an indication of warpage.

Figure 9A:
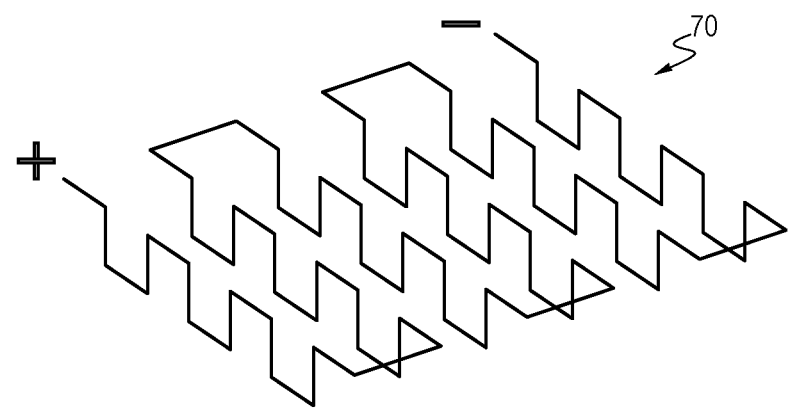
FIG. 9A is a diagram illustrating an embodiment in which a serpentine-shaped conductor runs across a plurality of zones in first and second wafers.
Figure 9B:
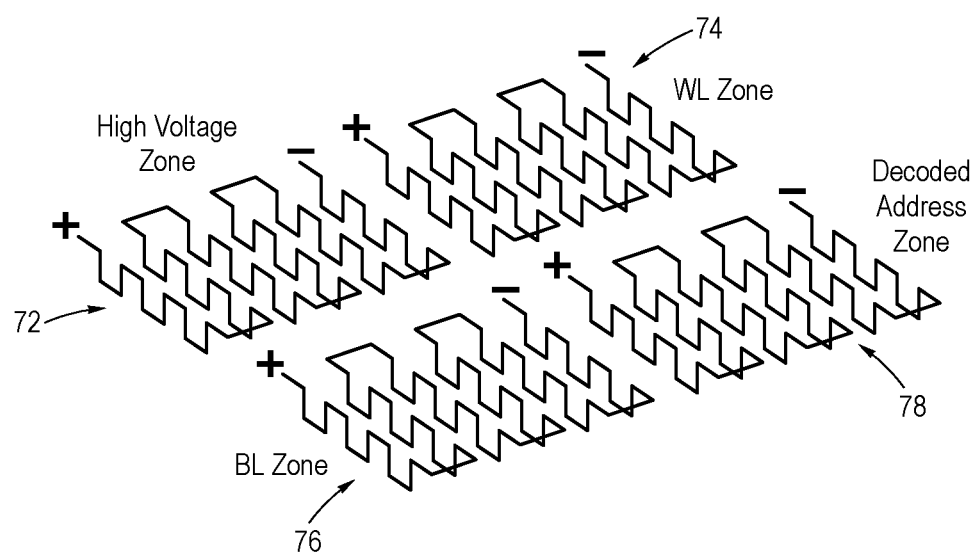
FIG. 9B is a diagram illustrating an embodiment in which a plurality of serpentine-shaped conductors runs across a plurality of zones in first and second wafers.

The conductor 40 can be arranged across the wafers 10, 20 in any suitable manner. For example, as shown in FIG. 9A, in one embodiment, a single conductor 40 runs across the entirely to the wafers 10, 20 (e.g., in an up-and-down, zig-zag pattern), with the upper half the conductor 40 being in the first wafer 10, and the lower half of the conductor 40 being in the second wafer 20. So, if the wafers 10, 20 have a plurality of zones, the single conductor 40 can run across some or all the zones. In another embodiment shown in FIG. 9B, multiple conductors are used across the wafers 10, 20, where each conductor runs across one of a plurality of zones 72, 74, 76, 78 in the first and second wafers 10, 20. In this example, the plurality of zones 72, 74, 76, 78 are a high-voltage zone 72, a wordline (WL) zone 74, a bitline (BL) zone 76, and a decode address zone 78. These are merely examples, and other zones can be used. Using multiple conductors avoids routing one very long conductor across the entire chip. In yet another alternative, one or more conductors can be positioned near important/critical signals, such as, but not limited to, Vcc signals, high-voltage program/erase signals, and address decoding signals.

Figure 10:
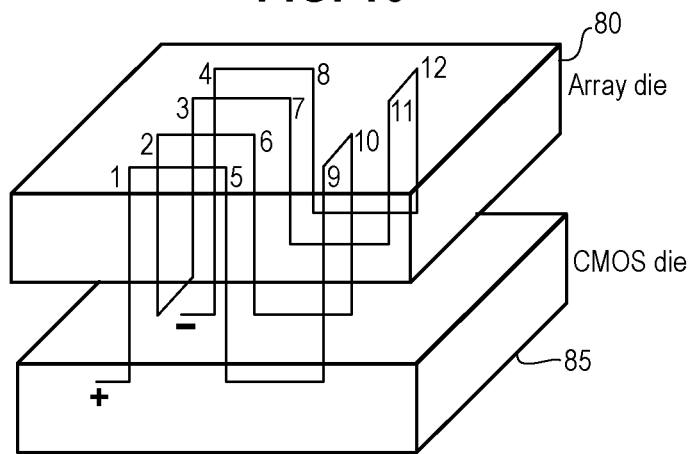
FIG. 10 is a diagram illustrating a serpentine-shaped conductor of an embodiment running through an array die and a CMOS die.
Figure 11:
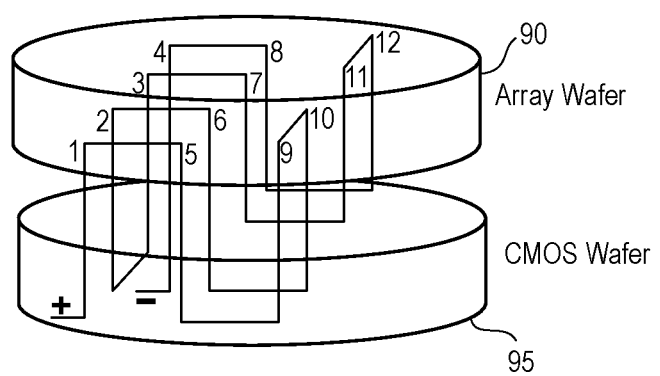
FIG. 11 is a diagram illustrating a serpentine-shaped conductor of an embodiment running through an array wafer and a CMOS wafer.

As noted above, these embodiments can be used to detect warpage within a die or within a wafer. FIG. 10 is a diagram illustrating detection of warpage within an array die 80 and/or CMOS die 85. In this example, there are N number of pillars and N number of zones. If Pillar 1 is disjointed, for example, the signals in Zone 1 will most likely also be disjointed. FIG. 11 is a diagram illustrating detection of warpage within an array wafer 90 and/or a CMOS wafer 95. In this example, there are N number of pillars and N number of zones. If Pillar 8 is disjointed, for example, the dice in Zone 8 will most likely also be disjointed.

In operation, these embodiments can be used to conduct a continuity test in the initial stages of a test flow. This way, warpage can be detected early on in the test process, which can save time. As such, this DFT structure can provide resolution detection that impacts the reliability of the die in the field. Without use of this structure, testing all contacts in the wafers 10, 20 can be very difficult, if not impossible.

There are many alternatives that can be used with these embodiments. For example, the serpentine-shaped structure can be in the streets and alleys between dice (scribe area), so as to not take up silicon area (assuming there is a test step to read it out). Also, these embodiments can be used for connectivity/resistivity testing, instead of or in addition to continuity testing. A bad contact may pass a continuity check but not carry a high-speed signal very well. Additionally, if the NAND device supports a boundary scan, the continuity detection circuitry can be connected to the boundary scan's scan chain. For example, a node can be placed on different ends of the serpentine structure. The node on one end can be set to "listen," and the node on the other end can be set to force a logical zero or a one. If the zero or one is not "heard" on the other end, that would indicate a problem. The reverse can also be done.

It is intended that the foregoing detailed description be understood as an illustration of selected forms that the invention can take and not as a definition of the invention. For example, it will be understood that the present technology may be used in any wafer-to-wafer bonding application, not just for a wafer having dies with CMOS circuitry bonded to a wafer having memory or NAND dies. It is only the following claims, including all equivalents that are intended to define the scope of the claimed invention. Finally, it should be noted that any aspect of any of the embodiments described herein can be used alone or in combination with one another.

What is claimed is:

1. An integrated circuit comprising:
a first wafer comprising a first plurality of contact pads;
a second wafer comprising a second plurality of contact pads, wherein at least some of the first plurality of contact pads are bonded to at least some of the second plurality of contact pads forming a plurality of pillars;
a conductor positioned in the first and second wafers and parallel to and offset from at least some of the plurality of pillars; and
a continuity check circuit electrically coupled with the conductor and configured to detect warpage in the first and/or second wafers by detecting an interruption in conductivity of the conductor.

2. The integrated circuit of claim 1, wherein the first wafer comprises a memory array and the second wafer comprises peripheral circuitry for the memory array.

3. The integrated circuit of claim 2, wherein the second wafer comprises a complementary metal-oxide-semiconductor (CMOS) wafer.

4. The integrated circuit of claim 1, wherein the continuity check circuit is in the second wafer.

5. The integrated circuit of claim 1, wherein the conductor runs through the first and second wafers and between at least some of the plurality of pillars in a serpentine shape.

6. The integrated circuit of claim 1, wherein the conductor runs across at least one of a plurality of zones in the first and second wafers.

7. The integrated circuit of claim 6, wherein the integrated circuit comprises at least one additional conductor electrically coupled with the continuity check circuit and running across at least one other zone of the plurality of zones.

8. The integrated circuit of claim 6, wherein the plurality of zones comprise one or more of the following: a high-voltage zone, a wordline zone, a bitline zone, and a decode address zone.

9. The integrated circuit of claim 1, wherein the conductor comprises a first portion formed in the first wafer and a second portion formed in the second wafer.

10. The integrated circuit of claim 9, wherein the first and second portions comprise respective horizontal and vertical components, and wherein at least some of the vertical components are bonded together.

11. The integrated circuit of claim 10, wherein the horizontal components comprise metal-filled trenches, and wherein the vertical components comprise metal-filled vertical interconnect access structures (vias).

12. An integrated circuit comprising:
a first wafer comprising a first plurality of electrical contacts;
a second wafer comprising a second plurality of electrical contacts, wherein at least some of the first plurality of electrical contacts are bonded to at least some of the second plurality of electrical contacts forming a plurality of pillars; and
means for detecting warpage in at least one of the first and second wafers, wherein the means for detecting warpage comprises a conductor that is parallel to and offset from at least some of the plurality of pillars.

13. The integrated circuit of claim 12, wherein the means for detecting warpage further comprises a continuity check circuit.

14. The integrated circuit of claim 12, wherein the conductor is serpentine shaped.

15. The integrated circuit of claim 12, wherein the conductor comprises a first portion formed in the first wafer and a second portion formed in the second wafer.

16. The integrated circuit of claim 15, wherein the first and second portions comprise respective horizontal and vertical components, wherein the horizontal components comprise metal-filled trenches, and wherein the vertical components comprise metal-filled vertical interconnect access structures (vias).

17. The integrated circuit of claim 12, wherein the first wafer comprises a NAND memory wafer and the second wafer comprises a complementary metal-oxide-semiconductor (CMOS) wafer.

18. A method for detecting warpage comprising:
providing an integrated circuit comprising:
a first wafer comprising a first plurality of contact pads;
a second wafer comprising a second plurality of contact pads, wherein at least some of the first plurality of contact pads are bonded to at least some of the second plurality of contact pads forming a plurality of pillars;
a conductor positioned in the first and second wafers and parallel to and offset from at least some of the plurality of pillars; and
a continuity check circuit electrically coupled with the conductor;
applying current through the conductor; and
using the continuity check circuit electrically to detect warpage in the first and/or second wafers by detecting an interruption in conductivity of the conductor.

19. The method of claim 18, wherein the first wafer comprises a memory array and the second wafer comprises a complementary metal-oxide-semiconductor (CMOS) wafer comprising peripheral circuitry for the memory array.

20. The method of claim 18, wherein the conductor runs across at least one of a plurality of zones in the first and second wafers.

\* \* \* \* \*